(12) United States Patent
Arya et al.

(10) Patent No.: US 7,489,479 B2
(45) Date of Patent: Feb. 10, 2009

(54) ELECTRICAL LEAD SUSPENSION HAVING PARTITIONED AIR SLOTS

(75) Inventors: Satya Prakash Arya, San Jose, CA (US); John Thomas Contreras, Palo Alto, CA (US); Klaas Klaassen, San Jose, CA (US); Nobumasa Nishiyama, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 451 days.

(21) Appl. No.: 11/037,906

(22) Filed: Jan. 18, 2005

(65) Prior Publication Data

US 2006/0158785 A1 Jul. 20, 2006

(51) Int. Cl.
  *G11B 5/48* (2006.01)
(52) U.S. Cl. .................. 360/245.9; 360/244.3; 360/246
(58) Field of Classification Search .............. 360/245.8, 360/245.9, 246, 244.3; 174/250, 254, 260
See application file for complete search history.

(56) References Cited

U.S. PATENT DOCUMENTS

| | | | | |
|---|---|---|---|---|
| 3,222,022 | A * | 12/1965 | Akin, Jr. .................. | 248/205.1 |
| 5,712,749 | A | 1/1998 | Gustafson | |
| 5,781,379 | A * | 7/1998 | Erpelding et al. ........ | 360/245.3 |
| 5,796,552 | A * | 8/1998 | Akin et al. ............... | 360/264.2 |
| 5,812,344 | A | 9/1998 | Balakrishnan | |
| 5,995,329 | A * | 11/1999 | Shiraishi et al. .......... | 360/245.9 |
| 6,038,102 | A | 3/2000 | Balakrishnan et al. | |
| 6,046,886 | A * | 4/2000 | Himes et al. ............. | 360/245.9 |
| 6,249,404 | B1 * | 6/2001 | Doundakov et al. ...... | 360/245.4 |
| 6,268,981 | B1 | 7/2001 | Coon et al. | |
| 6,295,183 | B1 | 9/2001 | Nuno et al. | |
| 6,351,348 | B1 | 2/2002 | Erpelding et al. | |
| 6,404,594 | B1 * | 6/2002 | Maruyama et al. ....... | 360/245.8 |
| 6,636,382 | B2 * | 10/2003 | Shiraishi .................. | 360/244.3 |
| 6,673,256 | B2 * | 1/2004 | Takasugi ..................... | 216/22 |
| 6,714,385 | B1 * | 3/2004 | Even et al. .................. | 360/246 |
| 6,762,913 | B1 * | 7/2004 | Even et al. .................. | 360/246 |
| 6,944,936 | B2 * | 9/2005 | Krinke .................... | 29/603.04 |
| 7,206,154 | B2 * | 4/2007 | Lee et al. ..................... | 360/67 |

(Continued)

FOREIGN PATENT DOCUMENTS

JP 2001256627 9/2001

(Continued)

*Primary Examiner*—Brian E Miller

(57) ABSTRACT

An electrical lead suspension (ELS) having partitioned air slots. The ELS includes a laminate. A first plurality of signal traces and a second plurality of traces are in a first formed layer of the laminate. The second plurality of traces may be signal traces or power traces. The laminate has a dielectric layer between the first formed layer and a second formed layer. A plurality of partitioned air slots is in the second formed layer of the laminate. The portion of the ELS having a plurality of partitioned air slots supporting the at least the first plurality of signal traces and the portion of the ELS having a second plurality of partitioned air slots or patterns supporting the second plurality of traces. The supporting of the first plurality of signal traces separate from the second plurality of traces reduces write-to-read cross talk and signal loss. Offsetting the first plurality of air slots from second plurality of air slots further reduces cross talk and signal loss and restores some of the structural rigidity lost due to in line (e.g., aligned) slots.

39 Claims, 11 Drawing Sheets

U.S. PATENT DOCUMENTS

| | | | |
|---|---|---|---|
| 7,372,669 B2 * | 5/2008 | Deguchi et al. | 360/245.9 |
| 7,408,744 B1 * | 8/2008 | Cuevas | 360/244.8 |
| 2002/0089791 A1 * | 7/2002 | Morley et al. | 360/245.9 |
| 2002/0105760 A1 | 8/2002 | Someya | |
| 2002/0181156 A1 * | 12/2002 | Shiraishi et al. | 360/245.9 |
| 2003/0193753 A1 | 10/2003 | Arai et al. | |
| 2004/0264056 A1 * | 12/2004 | Jang et al. | 360/245.9 |
| 2005/0180053 A1 * | 8/2005 | Dovek et al. | 360/246 |
| 2005/0219758 A1 * | 10/2005 | Roth | 360/246 |
| 2006/0152854 A1 * | 7/2006 | Arya et al. | 360/245.9 |
| 2006/0152855 A1 * | 7/2006 | Arya et al. | 360/246 |
| 2006/0158783 A1 * | 7/2006 | Arya et al. | 360/245.9 |
| 2006/0245112 A1 * | 11/2006 | Shum | 360/245.9 |

FOREIGN PATENT DOCUMENTS

| | | |
|---|---|---|
| JP | 2002170215 | 6/2002 |
| JP | 200303810 | 1/2003 |
| JP | 2003030810 A * | 1/2003 |
| WO | WO98/14937 | 4/1998 |

* cited by examiner

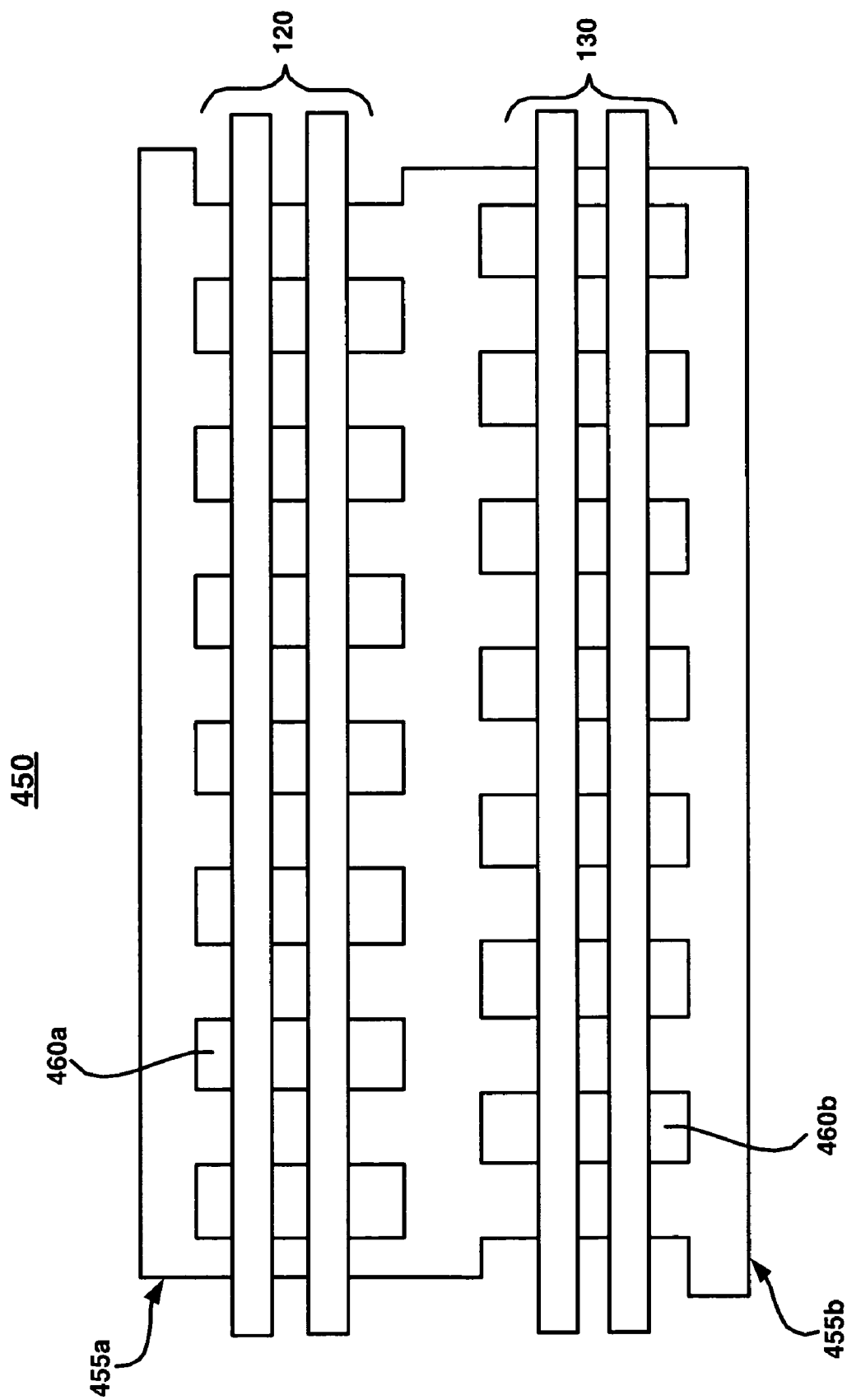

ELECTRICAL LEAD SUSPENSION HAVING PARTITIONED AIR SLOTS

TECHNICAL FIELD

The present invention relates to the field of electrical interconnect, and more particularly to an electrical lead suspension having partitioned air slots.

BACKGROUND ART

Hard disk drives are used in almost all computer system operations. In fact, most computing systems are not operational without some type of hard disk drive to store the most basic computing information such as the boot operation, the operating system, the applications, and the like. In general, the hard disk drive is a device which may or may not be removable, but without which the computing system will generally not operate.

The basic hard disk drive model was established approximately 50 years ago and resembles a phonograph. That is, the hard drive model includes a storage disk or hard disk that spins at a standard rotational speed. An actuator arm with a suspended slider is utilized to reach out over the disk. The arm carries a head assembly that has a magnetic read/write transducer or head for reading/writing information to or from a location on the disk. The complete head assembly, e.g., the suspension and head, is called a head gimbal assembly (HGA).

In operation, the hard disk is rotated at a set speed via a spindle motor assembly having a central drive hub. Additionally, there are tracks evenly spaced at known intervals across the disk. When a request for a read of a specific portion or track is received, the hard disk aligns the head, via the arm, over the specific track location and the head reads the information from the disk. In the same manner, when a request for a write of a specific portion or track is received, the hard disk aligns the head, via the arm, over the specific track location and the head writes the information to the disk.

Over the years, the disk and the head have undergone great reductions in their size. Much of the refinement has been driven by consumer demand for smaller and more portable hard drives such as those used in personal digital assistants (PDAs), MP3 players, and the like. For example, the original hard disk drive had a disk diameter of 24 inches. Modern hard disk drives are much smaller and include disk diameters of less than 2.5 inches (micro drives are significantly smaller than that). Advances in magnetic recording are also primary reasons for the reduction in size.

However, the decreased track spacing and the overall reduction in HDD component size and weight have resulted in problems with respect to the electrical lead suspension (henceforth referred to as ELS), used in a Data Access Storage Device (DASD), e.g., a hard disk drive (HDD). For example, a typical ELS is formed from a laminate comprised of at least three layers of material. These laminate layers may include a signal-conductor layer from which signal traces are formed, a dielectric layer for insulation supporting the signal-conductor layer, and a conductive base-metal layer supporting the dielectric layer.

Prior Art FIG. 1 is a top plan view 100 of an ELS tail portion having write traces 120 and read traces 130 formed from the signal-conductor layer above a laminate dielectric layer. The dielectric layer is provided above the base-metal layer of the laminate. The supporting base-metal layer is formed having continous airslots under the read 130 write 120 pairs, so as to allow the head to fly properly and providing the necessary amount of mechanical stiffness for supporting the signal traces 120 and 130 that are the read and write traces. While the slotted base-metal layer can provide the appropriate mechanical stiffness, this metal layer and continous airslots underneath the read and write traces 120 and 130 results in write-to-read cross-talk that degrades the performance of the read sensor. For example, the read traces 130 connect to a voltage-sensitive read sensor. However, the write driver utilizes a large voltage to produce a current in the write traces 120 that will interact with the base-metal layer 110 and produce a current in read traces 130. This production of non-desired current in read traces 130 from the voltage applied to write traces 130 is detrimental to the overall function of the ELS. Moreover, as the size of the ELS is reduced, the amount of voltage required by the write traces 120 to cause interference with the read traces 130 is also reduced.

SUMMARY

An electrical lead suspension (ELS) having partitioned air slots. The ELS includes a laminate. A first plurality of signal traces and a second plurality of traces are in a first formed layer of the laminate. The second plurality of traces may be signal traces or power traces. The laminate has a dielectric layer between the first formed layer and a second formed layer. A plurality of partitioned air slots is in the second formed layer of the laminate. The portion of the ELS having a plurality of partitioned air slots supporting the at least the first plurality of signal traces and the portion of the ELS having a second plurality of partitioned air slots or patterns supporting the second plurality of traces. The supporting of the first plurality of signal traces separate from the second plurality of traces reduces write-to-read cross talk and signal loss. Offsetting the first plurality of air slots from second plurality of air slots further reduces cross talk and signal loss and restores some of the structural rigidity lost due to in line (e.g., aligned) slots.

BRIEF DESCRIPTION OF THE DRAWINGS

Prior Art

FIG. 4b is a top view of a portion of an ELS having read and write traces supported individually by a first offset air slot pattern misaligned with a second offset air slot pattern, respectively, of a dual offset air slot pattern, in accordance with one embodiment of the present invention.

BEST MODES FOR CARRYING OUT THE INVENTION

Reference will now be made in detail to the alternative embodiment(s)s of the present invention, an electrical lead suspension having partitioned air slots. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The discussion will begin with an overview of an electrical lead suspension (ELS) in conjunction with its operation within a hard disk drive and components connected therewith. The discussion will then focus on embodiments of a method for an electrical lead suspension having partitioned air slots in particular.

Figure 1:
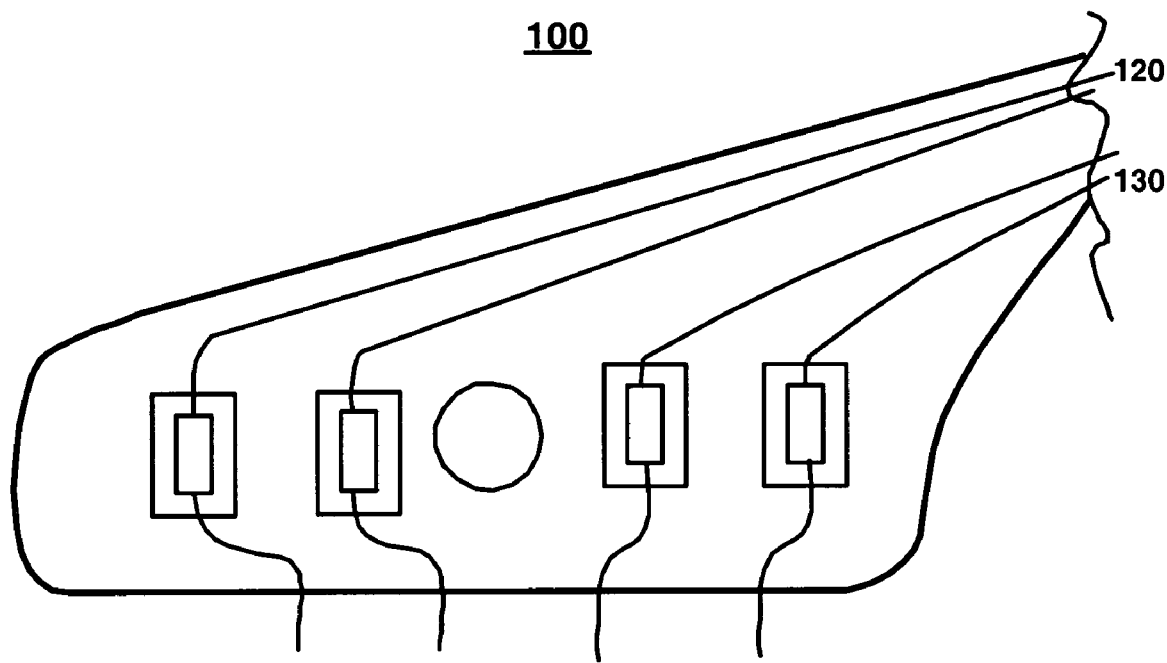
FIG. 1 is a top plan view of a portion of an ELS tail having read and write traces separated by an dielectric layer, according to an embodiment of the conventional art.
Figure 2:
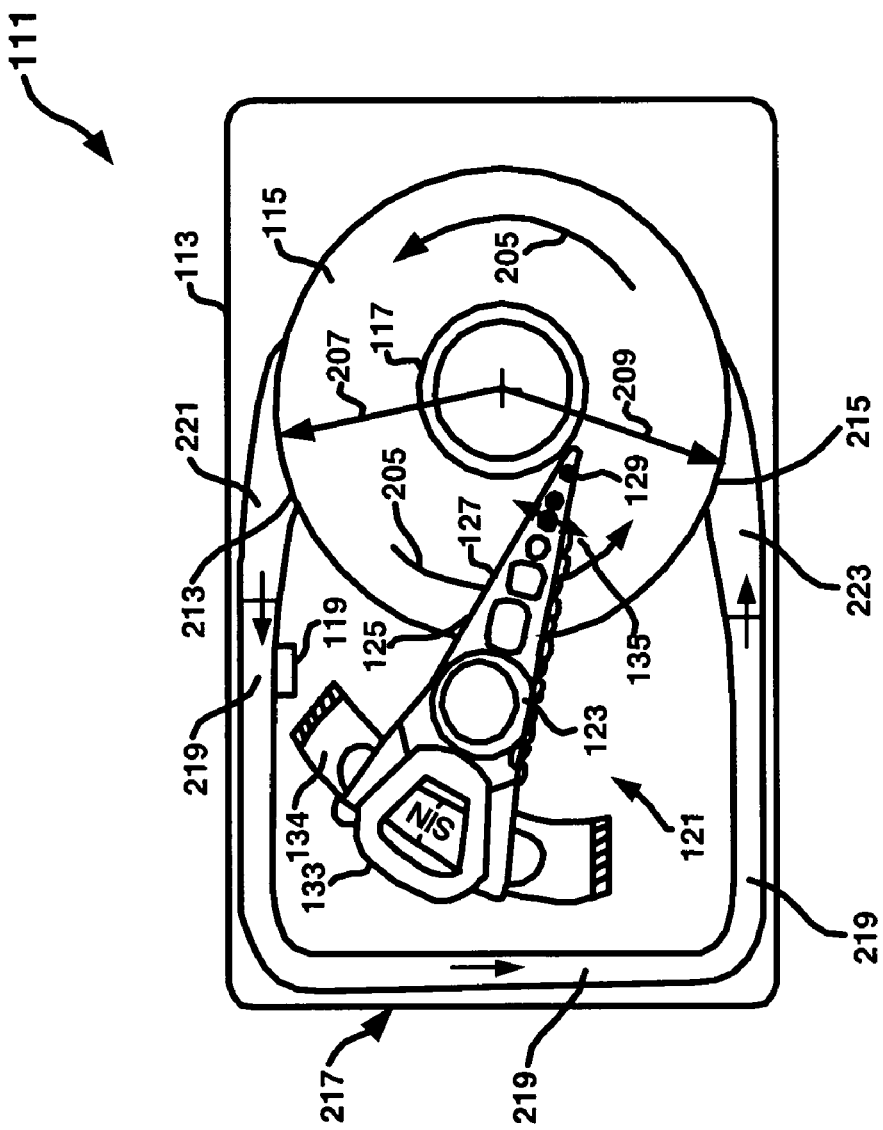
FIG. 2 is a schematic top plan view of a hard disk drive, in accordance with one embodiment of the present invention.

With reference now to FIG. 2, a schematic drawing of one embodiment of an information storage system comprising a magnetic hard disk file or drive 111 for a computer system is shown. Drive 111 has an outer housing or base 113 containing a disk pack having at least one media or magnetic disk 115. A spindle motor assembly having a central drive hub 117 rotates the disk or disks 115. An actuator 121 comprises a plurality of parallel actuator arms 125 (one shown) in the form of a comb that is movably or pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered load beam and electrical lead suspension (ELS) 127. It should be understood that ELS 127 may be, in one embodiment, an integrated lead suspension (ILS) that is formed by a subtractive process. In another embodiment, an additive process, such as a Circuit Integrated Suspension (CIS), may form ELS 127. In yet another embodiment, ELS 127 may be a Flex-On Suspension (FOS) attached to base-metal or it may be a Flex Gimbal Suspension Assembly (FGSA) that is attached to a base-metal layer. The ELS may be any form of lead suspension that can be used in a Data Access Storage Device, such as a HDD. A magnetic read/write transducer or head is mounted on a slider 129 and secured to a flexure that is flexibly mounted to each ELS 127. The read/write heads magnetically read data from and/or magnetically write data to disk 115. The level of integration called the head gimbal assembly is the head and the slider 129, which are mounted on ELS 127. The slider 129 is usually bonded to the end of ELS 127.

ELS 127 has a spring-like quality, which biases or presses the air-bearing surface of the slider 129 against the disk 115 to cause the slider 129 to fly at a precise distance from the disk. ELS 127 has a hinge area that provides for the spring-like quality, and a flexing interconnect (or flexing interconnect) that supports read and write traces through the hinge area. A voice coil 133, free to move within a conventional voice coil motor magnet assembly 134 (top pole not shown), is also mounted to arms 125 opposite the head gimbal assemblies. Movement of the actuator 121 (indicated by arrow 135) by controller 119 causes the head gimbal assemblies to move along radial arcs across tracks on the disk 115 until the heads settle on their set target tracks. The head gimbal assemblies operate in a conventional manner and always move in unison with one another, unless drive 111 uses multiple independent actuators (not shown) wherein the arms can move independently of one another.

Although embodiments of the present invention are described in the context of an ELS in an information storage system, it should be understood that embodiments may apply to any device utilizing an electrical interconnect that might experience signal loss and cross talk between signal traces. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. The signal traces may also be replaced with power traces according to one embodiment.

Figure 3:
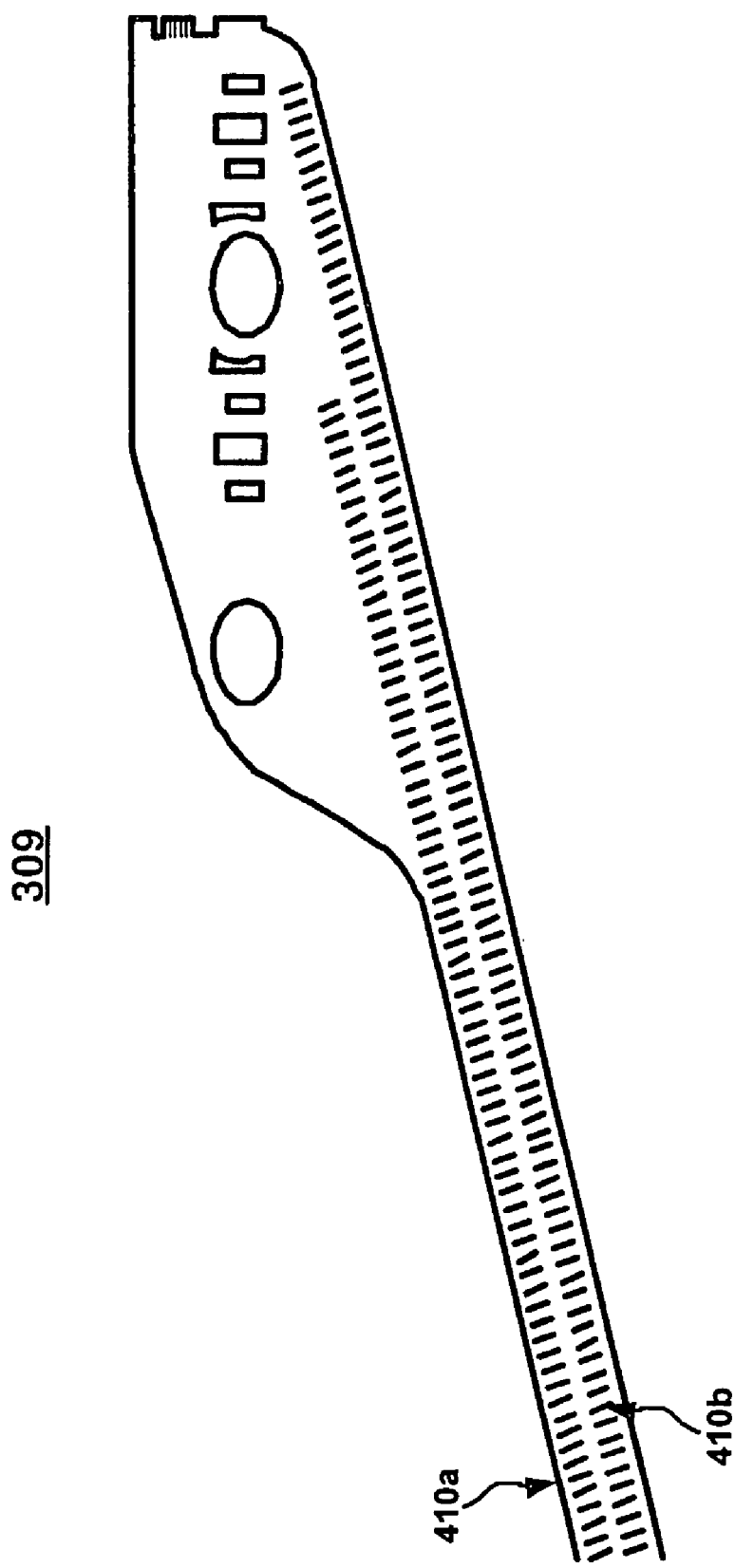
FIG. 3 is a top plan view of an ELS having read and write traces that are supported by a dual air slot pattern in at least the tail area of the ELS, in accordance with an embodiment of the present invention.

FIG. 3 is a top plan view of a tail portion 309 of the ELS 127 that has a base-metal layer 802 (see FIG. 8) with dual air slots 430a and 430b (e.g., microwindows) in at least the tail portion 309 of the ELS 127 of FIG. 2, in accordance with an embodiment of the present invention. In one embodiment, the slots in two rows of partitioned air slots are aligned such as those further described in the discussion of FIG. 4a. In another embodiment, the air slots in the two rows of air slots are offset such as those further described in the discussion of FIG. 4b. In yet another embodiment, the air slots 430a and 430b are a combination of aligned partitioned dual air slots such as those further described in the discussion of FIG. 4a and FIG. 4b.

In one embodiment, the air slot patterns 430a and 430b are both sets of repeating narrow open air slots, formed in the stainless steel ground plane 802 in a location which would be under one of each signal conductor pair (e.g., read 130/write 120 traces of FIGS. 4a and 4b) on a tail portion of the ELS. The added air slots, e.g., 430a and/or 430b, reduce signal amplitude loss by disrupting/reducing flow of differential return currents between the read and write traces such as those shown in FIGS. 4a and 4b. Also, the independent and unconnected air slots in the ground plane reduce read to write coupling/cross talk between the read and write traces such as those shown in FIGS. 4a and 4b. In another embodiment, described herein, the airslots or microwindows are used in other areas of the ELS 127 including the flexible hinge area.

Figure 4A:
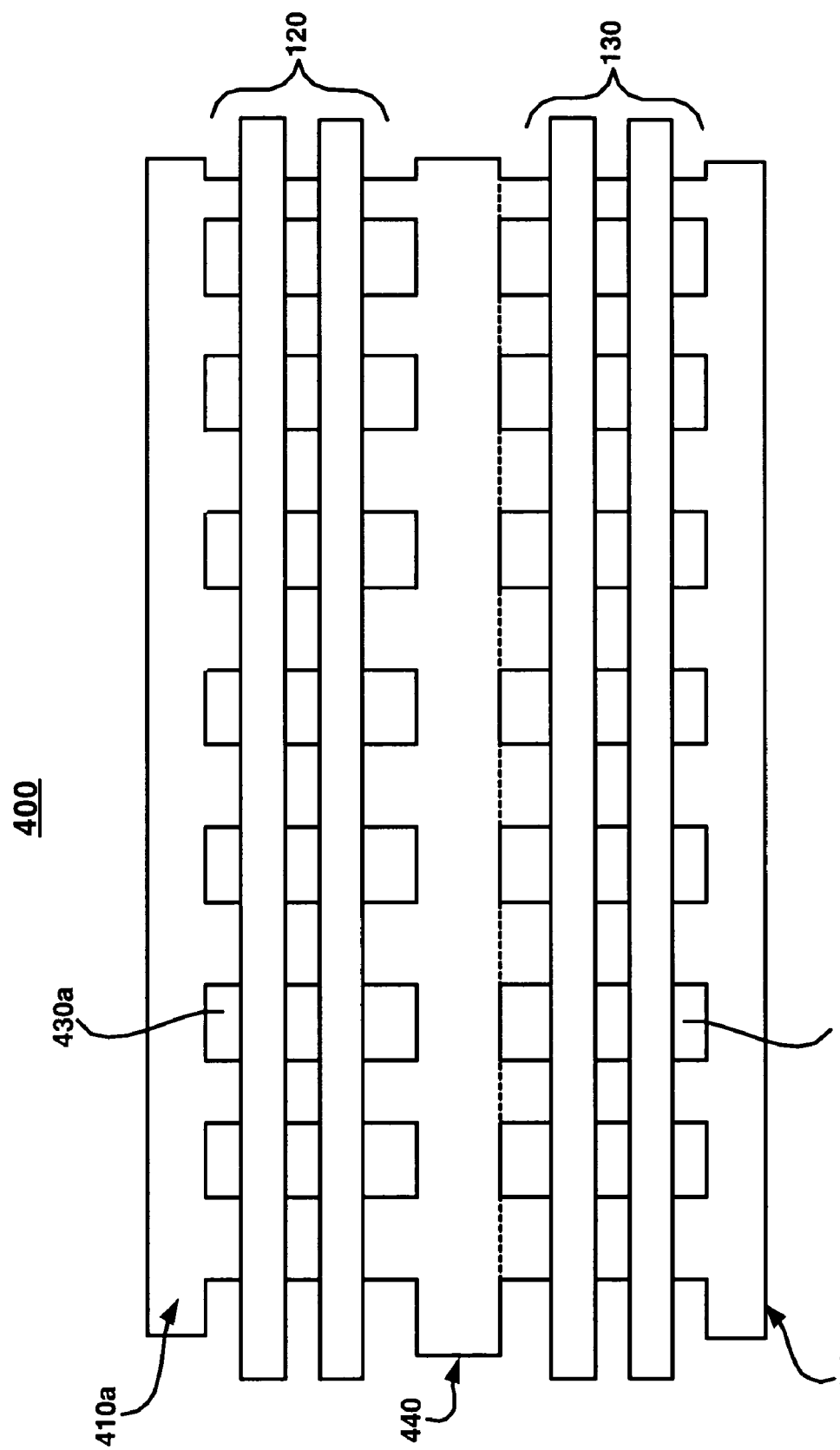
FIG. 4a is a top view of a portion of an ELS having read and write traces supported individually by aligned a first air slot pattern and a second air slot pattern, respectively, of a dual partitioned air slot pattern, in accordance with one embodiment of the present invention.
Figure 5:
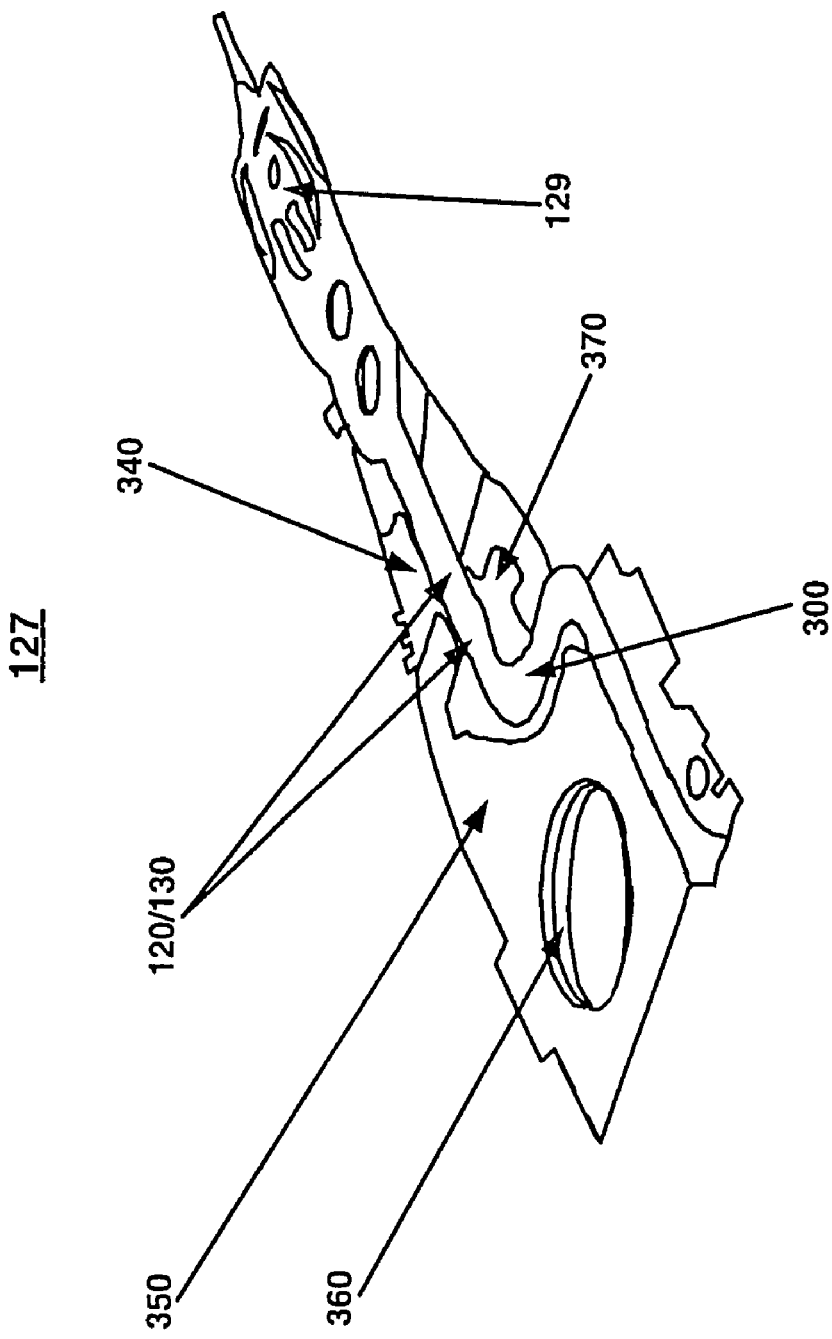
FIG. 5 is a top plan view of an ELS having read and write traces that are supported by a dual air slot pattern in a flexing interconnect area of the ELS, according to one embodiment of the present invention.

FIG. 4a is a top view of a portion 400 of an ELS tail portion, e.g., ELS tail portion 309 of FIG. 3 and/or a flexing interconnect, e.g. flexing interconnect 300 of FIG. 5, having write traces 120 and read traces 130 formed of the signal-conductor layer supported individually by dielectric layer, and then a first support 410a having air slot pattern 430a and a second support 410b having air slot pattern 430b, wherein the first air slot pattern 430a and the second air slot pattern 430b are aligned with one another with a partition 440 in between to form a dual air slot pattern formed of a base-metal layer, in accordance with one embodiment of the present invention. In one embodiment, the aligned and partitioned air slot pattern is used in a high data rate interconnect having independent air slots in the electrical lead suspension.

In one embodiment, the air slot patterns are both sets of repeating narrow open air slots, e.g., 430a and 430b respectively, formed in the stainless steel ground plane 802 under each signal conductor pair (e.g., read 130/write 120 traces) on a tail portion of the ELS or other portion of the ELS such as the suspension interconnect portion. The added air slots, e.g., 430a and 430b, reduce signal amplitude loss by disrupting/reducing flow of differential return currents. Also, the independent offset and unconnected air slots, e.g., 430a and 430b, in the ground plane 802 for each conductor pair, reduce read to write coupling/cross talk.

For example, the portion 400 of FIG. 4a comprises a laminate for supporting attached devices, according to one embodiment of the present invention. A plurality of read traces 130 are formed of the signal-conductor layer, according to one embodiment, as are a plurality of write traces 120. Supports 410a and 410b are formed of a layer, e.g., base-metal layer 802 of FIG. 8, of the laminate. The first dual air slot pattern 430a is under the plurality of write traces 120 and the second dual air slot pattern 430b is under the plurality of read traces 130 above the ELS 127. In so doing, the aligned and partitioned air slot pattern under the plurality of write traces 120 separate from the plurality of read traces 130 reduces write-to-read cross talk and signal loss.

That is, in one embodiment, the air slots 430a and 430b are 30 to 50 μm wide and go across both conductors in a pair as shown. Instead of using a common slot for both read 130 and write 120 conductor pairs, each pair has a partition portion 440. That is, the air slots 430a of support portion 410a under write traces 120 are separated from the air slots 430b of support portion 410b under read traces 130 by the partition 440. The added partition 440 to the air slots disrupt/reduce the flow of differential return currents in the ground plane 802 resulting in lower signal loss throughout the tail portion of the ELS. Also independent and unconnected air slots 430a and 430b in the ground plane 802 for each conductor pair reduce read to write coupling and work like a shield against cross talk between adjacent signal conductor pairs and surrounding interference signals inside the hard-disk-drive 111 enclosure.

According to one embodiment, the layered laminate from which the ELS 127 is formed comprises at least a signal-conductor layer, e.g. copper alloy, a dielectric layer, e.g. polyimide, and a base-metal layer, e.g. stainless steel. The dielectric layer is sandwiched between the signal-conductor layer and the base-metal layer to form a laminate. The plurality of read traces 130 and the plurality of write traces 120 can be formed of the layer of signal-conductor layer. Although copper alloy is specified herein, it should be understood that any material having high electrical conductivity, from which write traces 120 and read traces 130 can be formed, may be substituted for the copper alloy. The dielectric layer can be any dielectric that would be appropriate for insulating the read and write traces from the supporting base-metal layer.

Figure 8:
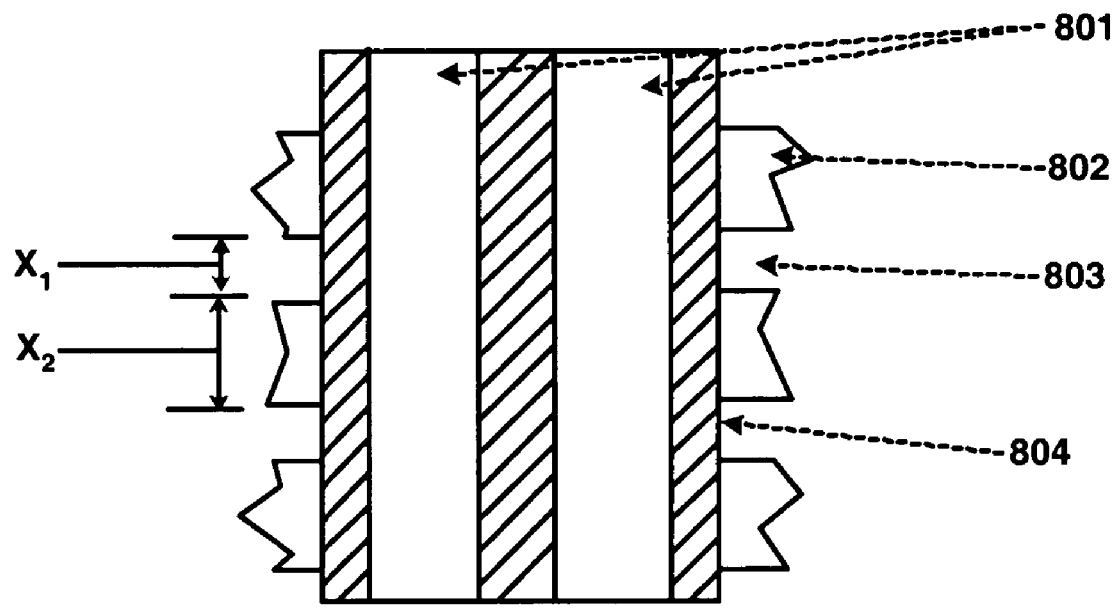
FIG. 8 is a top view of signal traces over a section of the dual offset air slot base-metal layer separated by a dielectric layer, in accordance with one embodiment of the present invention.

Still referring to FIG. 4a, the dual air slots 430a and 430b are formed of the base-metal layer, according to one embodiment. This layer may be stainless steel, or it may be any base-metal that would have the appropriate mechanical stiffness, electrical characteristics and manufacturability needed. Refer to FIG. 8 for further details of the electrical characteristics.

According to one embodiment of the present invention, the mechanical stiffness of tail portion 309 of FIG. 3 and further the flexing interconnect 300 of the FIG. 5, and portion 400 thereof of FIG. 4a, is also affected by the period and the geometry of the air slots 430a and 430b. The geometries of at least one pattern of dual offset air slots 430a and 430b are alterable to achieve a predefined mechanical stiffness. A compromise may be reached to achieve both an acceptable mechanical stiffness and characteristic impedance for signal traces.

In one embodiment, supports 410a and 410b are formed from a single piece of a base-metal layer to form the desired partitioned air slot pattern. In another embodiment, supports 410a and 410b are formed from two pieces of a base-metal layer that are fit together to form the desired dual partitioned air slot pattern. In yet another embodiment, supports 410a and 410b are formed from a plurality of pieces of a base-metal layer that are fit together to form the desired partitioned air slot pattern. In one embodiment, the air slot patterns are formed in the base-metal layer via stamping, etching, molding, casting, cutting or the like.

FIG. 4b is a top view of a portion 450 of an ELS tail portion, e.g., ELS tail Portion 309 of FIG. 3 and/or a flexing interconnect, e.g. flexing interconnect 300 of FIG. 5, having write traces 120 and read traces 130 formed of the signal-conductor layer supported individually by dielectric layer, and then a first support 455a having air slot pattern 460a therein and a second support 455b having air slot pattern 460b therein, wherein the first air slot pattern 460a and the second air slot pattern 460b are offset and independent from one another to form a dual offset air slot pattern of the flexing interconnect support formed of a base-metal layer, in accordance with one embodiment of the present invention.

In one embodiment, the air slot patterns are both sets of repeating narrow open air slots, e.g., 460a and 460b respectively, formed in the stainless steel ground plane 802 under each signal conductor pair (e.g., read 130/write 120 traces) on a portion of the ELS 127 such as on the tail portion, a suspension interconnect, or the like. The added air slots, e.g., 460a and 460b, reduce signal amplitude loss by disrupting/reducing flow of differential return currents. Also, the independent offset and unconnected air slots, e.g., 460a and 460b, in the ground plane 802 for each conductor pair, reduce read to write coupling/cross talk.

For example, the portion 450 of FIG. 4b comprises a laminate for supporting attached devices, according to one embodiment of the present invention. A plurality of read traces 130 are formed of the signal-conductor layer, according to one embodiment, as are a plurality of write traces 120. Supports 455a and 455b are formed of a layer, e.g., base-metal layer 802 of FIG. 8, of the laminate. The first dual offset air slot pattern 460a is under the plurality of write traces 120 and the second offset air slot pattern 460b is under the plurality of read traces 130 above at least a portion of the ELS such as the tail portion 309 of FIG. 3, the hinge area 370 of FIG. 5, or the like. In so doing, the dual offset air slot pattern under the plurality of write traces 120 separate from the plurality of read traces 130 reduces write-to-read cross talk and signal loss.

That is, in one embodiment, the air slots 460a and 460b are 30 to 50 μm wide and go across both conductors in a pair as shown. Instead of using a common slot for both read 130 and write 120 conductor pairs, each pair has a separate series of slots offset from the other one. That is, the air slots of 460a under write traces 120 are offset from the air slots 460b under read traces 130. The added offset air slots disrupt/reduce the flow of differential return currents in the ground plane 802 resulting in lower signal loss. Also independent, offset and unconnected air slots 460a and 460b in the ground plane 802 for each conductor pair, reduce read to write coupling and work like a shield against cross talk between adjacent signal conductor pairs and surrounding interference signals inside the hard disk-drive 111 enclosure.

According to one embodiment, the layered laminate from which the structure 450 is formed comprises at least a signal-conductor layer, e.g. copper alloy, a dielectric layer, e.g. polyimide, and a base-metal layer, e.g. stainless steel. The dielectric layer is sandwiched between the signal-conductor layer and the base-metal layer to form a laminate. The plurality of read traces 130 and the plurality of write traces 120 can be formed of the layer of signal-conductor layer. Although copper alloy is specified herein, it should be understood that any material having high electrical conductivity, from which write traces 120 and read traces 130 can be formed, may be substituted for the copper alloy. The dielectric layer can be any dielectric that would be appropriate for insulating the read and write traces from the supporting base-metal layer.

Still referring to FIG. 4b, the dual offset supports 455a and 455b are formed of the base-metal layer, according to one embodiment. This layer may be stainless steel, or it may be any base-metal that would have the appropriate mechanical stiffness, electrical characteristics and manufacturability needed. Refer to FIG. 8 for further details of the electrical characteristics.

According to one embodiment of the present invention, the mechanical stiffness of the ELS 127, and portion 450 thereof of FIG. 4b, is also affected by the period and the geometry of the offset air slots 460a and 460b within the supports 455a and 455b. The geometries of at least one pattern 455a or 455b of dual offset air slots 460a and 460b are alterable to achieve a predefined mechanical stiffness. A compromise may be reached to achieve both an acceptable mechanical stiffness and characteristic impedance for signal traces.

In one embodiment, supports 455a and 455b are formed from two pieces of a base-metal layer that are fit together to form the desired dual offset air slot pattern. In another embodiment, supports 455a and 455b are formed from a single piece of a base-metal layer to form the desired dual offset air slot pattern. In yet another embodiment, supports 455a and 455b are formed from a plurality of pieces of a base-metal layer that are fit together to form the desired dual offset air slot pattern. In one embodiment, the offset patterns are formed in the base-metal layer via stamping, etching, molding, casting, cutting or the like.

In one embodiment, the air slot pattern 410a is a set of repeating narrow open air slots formed in the stainless steel ground plane 802 under one signal conductor pair (e.g., read 130 or write 120 traces) on a tail portion of the ELS or other portion of the ELS such as the suspension interconnect portion.

The single air slot pattern 410a keeps the plurality of write traces 120 separate from the plurality of read traces 130 reduces write-to-read cross talk and signal loss.

In one embodiment, the air slots 410a are 30 to 50 μm wide and go under one of the conductor pairs. Instead of using a common slot for both read 130 and write 120 conductor pairs, only one pair has an air slot. That is, the air slots (eg., 410a or 410b of FIG. 4a) is either under write traces 120 or under read traces 130 but not both. Thus, the air slots disrupt/reduce the flow of differential return currents in the ground plane 802 resulting in lower signal loss throughout the tail portion of the ELS. Also independent and unconnected air slots (e.g., 410a or 410b of FIG. 4a )in the ground plane 802 for each conductor pair reduce read to write coupling and work like a shield against cross talk between adjacent signal conductor pairs and surrounding interference signals inside the disk 111 enclosure.

With reference now to FIG. 5, a top plan view of an ELS 127 having a flexing interconnect 300, according to one embodiment of the present invention. The read and write traces, 130 and 120, respectively, pass through the hinge center 370 of ELS 127, where loadbeam 340 connects, via hinge plate 350, to mount plate 360, according to one embodiment of the present invention. A slider resides toward the end 129 0f ELS 127, and contains the read/write head.The slider is bonded to read and write traces 130 and 120, respectively, where read and write signals are carried to and from the read/write head.

Flexing interconnect 300 of ELS 127 can be formed of a laminate that is, according to one embodiment, of at least three layers of materials. A signal-conductor layer may be a highly conductive metal, e.g., copper, from which the read and write traces 130 and 120, respectively are formed. A middle layer can be an insulating dielectric layer, e.g., polyimide, separating the top layer from which write and read traces 120 and 130 respectively, are formed of a base-metal layer 802, such as stainless steel, in which offset air slots are formed.

Figure 6A:
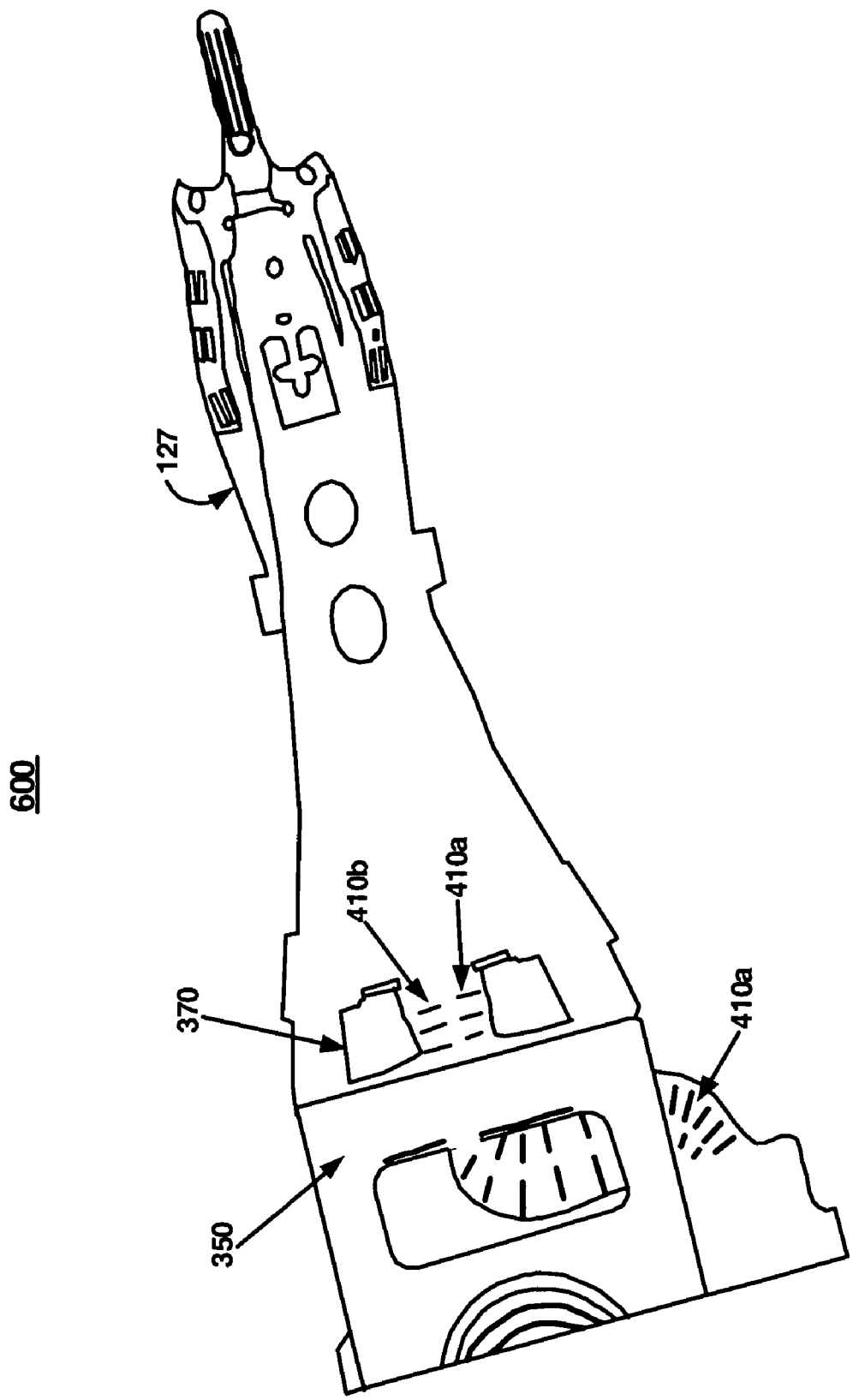
FIG. 6a is a bottom plan view of ELS 127 showing an aligned dual partitioned air slot pattern support as it traverses the hinge area of ELS 127, in accordance with an embodiment of the present invention.

FIG. 6a is a bottom plan view 600 of an ELS 127 showing dual air slot pattern supports 410a and 410b having dual air slots e.g., 430a and 430b of FIG. 4a, as they traverse the center of hinge area 370 and onto hinge plate 350 of ELS 127, in accordance with an embodiment of the present invention. In another embodiment, write traces 120 and read traces 130 may be supported by supports 455a and 455b having offset and independent dual airslots e.g., 460a and 460b of FIG. 4b, or a combination thereof anywhere along the tail portion 309 of ELS 127.

Figure 6B:
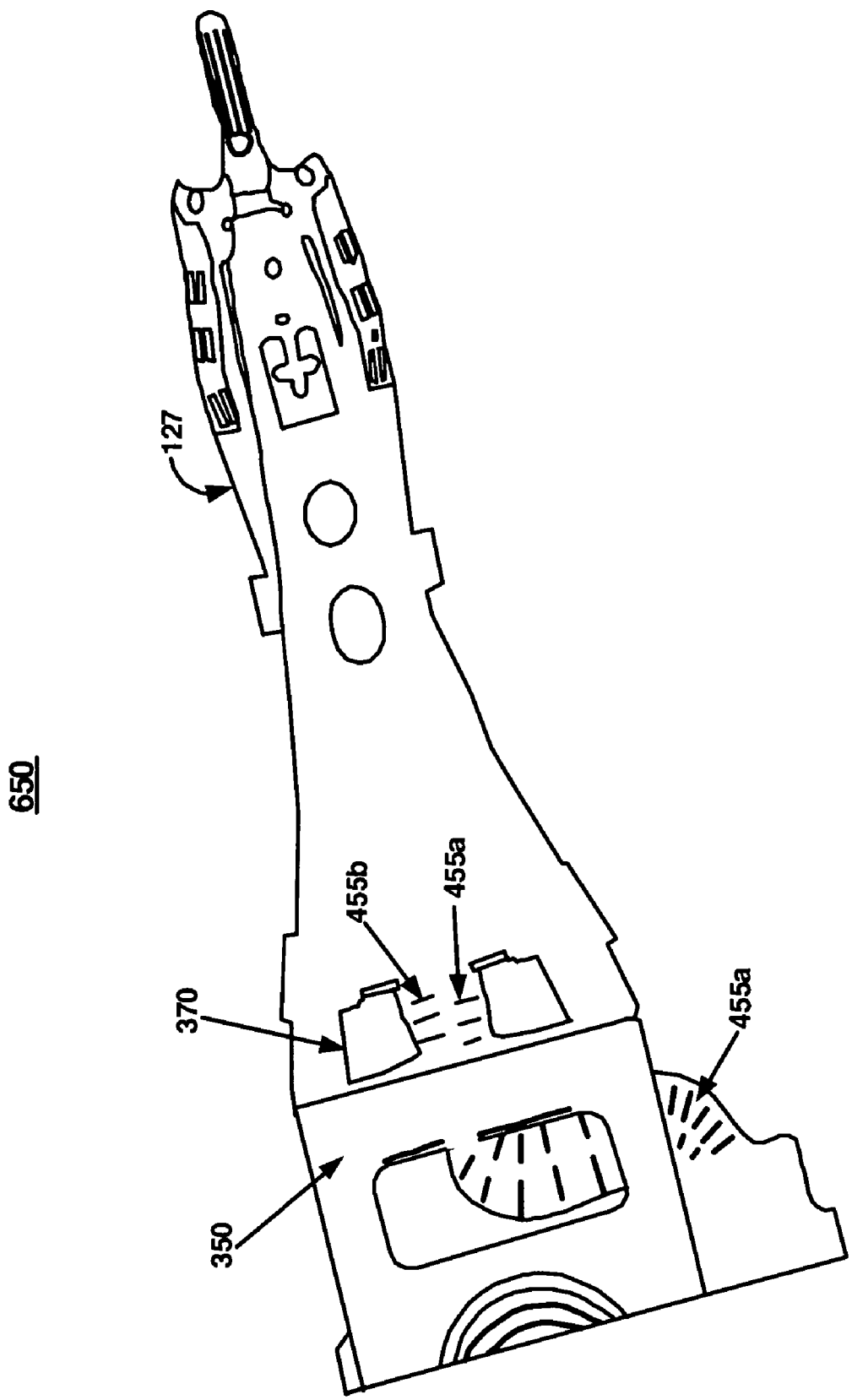
FIG. 6b is a bottom plan view of ELS 127 showing a misaligned dual offset air slot pattern support as it traverses the hinge area of ELS 127, in accordance with an embodiment of the present invention.

FIG. 6b is a bottom plan view 650 of an ELS 127 showing dual offset air slot pattern supports 455a and 455b having offset and independent dual airslots e.g., 460a and 460b of FIG. 4b as they traverse the center of hinge area 370 and onto hinge plate 350 of ELS 127, in accordance with an embodiment of the present invention. In another embodiment, write traces 120 and read traces 130 may be supported by aligned and partitioned supports 410a and 410b having dual air slots e.g., 430a and 430b of FIG. 4a, or a combination thereof anywhere along the tail portion 309 of ELS 127.

Figure 7:
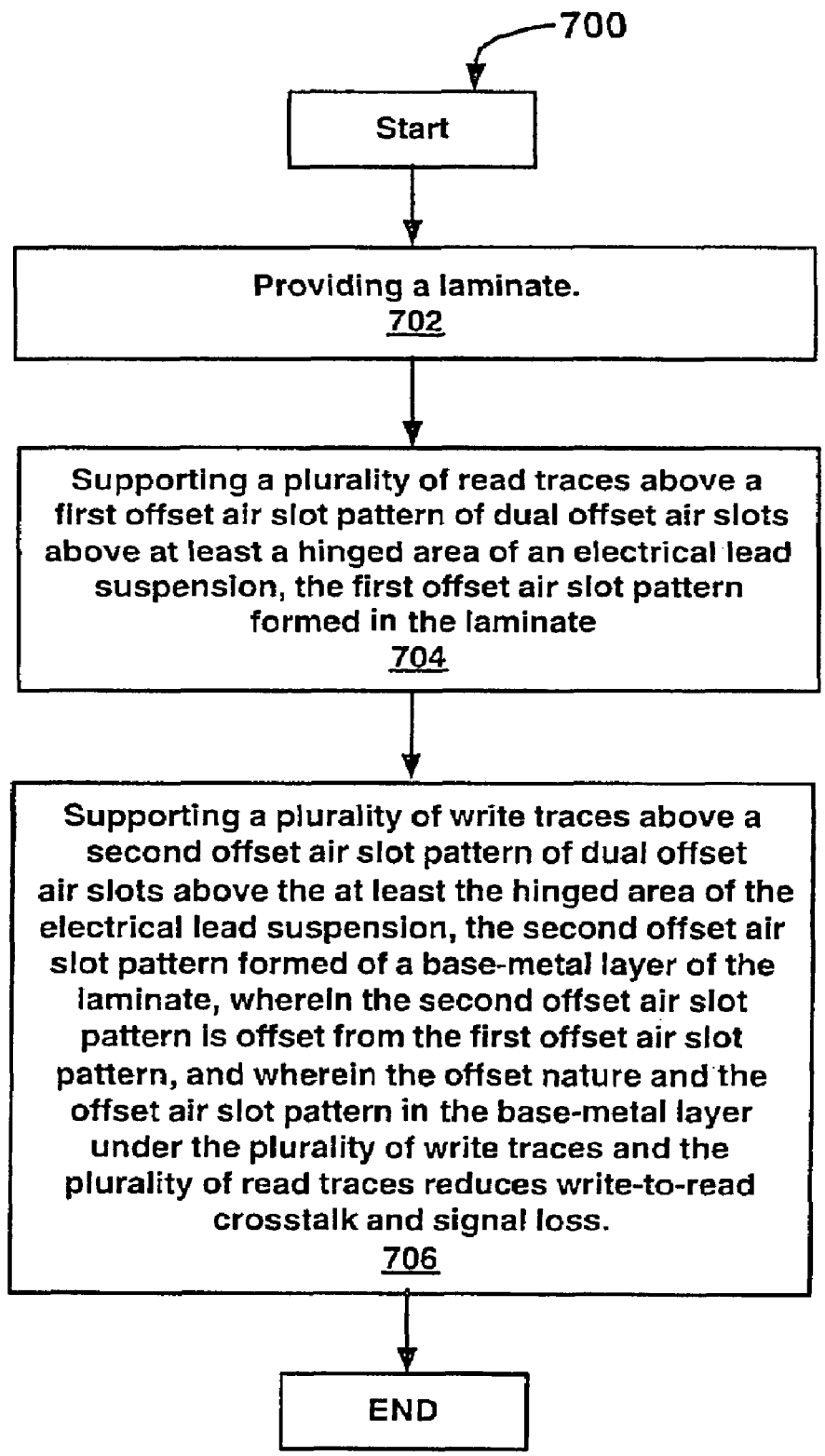
FIG. 7 is a flow diagram of a method for obtaining low cross talk and signal loss in a flexing interconnect, in accordance with one embodiment of the present invention.

FIG. 7 is a flow diagram of a method 700 for reducing cross talk and signal loss in a flexing interconnect (e.g. flexing interconnect 300 of FIG. 5) having aligned or offset air slots of an electrical lead suspension, in accordance with one embodiment of the present invention. For example, as shown in FIGS. 4a and 4b, instead of using a common slot for both read 130 and write 120 conductor pairs, each pair has a separate series of slots either aligned or offset from the other one. That is, the air slots of 430a of FIG. 4a are aligned with the air slots 430b, while the air slots 460a are offset with the air slots 460b. The aligned and offset air slots disrupt/reduce the flow of differential return currents in the ground plane 802 resulting in lower signal loss. Also independent, offset and unconnected air slots 460a and 460b in the ground plane 802 for each conductor pair, reduce read to write coupling and work like a shield against cross talk between adjacent signal conductor pairs and surrounding interference signals inside the hard-disk-drive 111 enclosure.

With reference now to step 702 of FIG. 7 and to FIG. 2, one embodiment provides a laminate. In one embodiment, the laminate is provided in the tail portion of the ELS (e.g., tail portion 309 of FIG. 3). The laminate, according to one embodiment, has at least a signal-conductor layer, a dielectric layer and a base-metal layer. The dielectric layer resides between the signal-conductor layer and the base-metal layer.

Referring now to step 704 of FIG. 7 and to FIGS. 4a and 4b, one embodiment supports a plurality of read traces, e.g., read traces 130 of FIG. 4a, above aligned air slot pattern 430b of dual aligned air slots 430a and 430b (or offset air slot pattern 460b of dual offset air slots 460a and 460b above at least a tail portion 309 (of FIG. 3) of an ELS 127, the aligned air slot pattern 430b (or offset air slot pattern 460b) being formed in the base-metal layer 802 of the laminate in accordance with defined air gap to base-metal dimension ratio, K. The plurality of read traces are, according to one embodiment, formed of a signal-conductor layer.

With reference now to step 706 of FIG. 7 and to FIGS. 4a and 4b, one embodiment provides a plurality of air slots (e.g., aligned air slots 430a and 430b, and offset air slots 460a and 460b) in a second formed layer of the laminate, the plurality of air slots having openings under both the first plurality of signal traces (e.g., write traces 120) and the second plurality of traces (e.g., read traces 130). In one embodiment, the aligned air slots (e.g., aligned air slots 430a and 430b) are partitioned 440 between the openings (e.g., aligned air slots 430a and 430b) under the first plurality of signal traces 120 and the second plurality of traces 130. In one embodiment, the ELS with the plurality of air slots (e.g., aligned air slots 430a and 430b, and offset air slots 460a and 460b) supports the dielectric layer supporting the plurality of signal traces and the subsequent plurality of patterns supporting the dielectric layer supporting the subsequent plurality of traces, wherein the supporting the subsequent plurality of traces separate from said plurality of signal traces reduces signal loss and cross talk between said plurality of signal traces and said subsequent plurality of traces. In other words, in one embodiment, e.g., FIG. 4a, the second air slot pattern 430b is aligned with the first air slot pattern 430a with a partition 440 to reduce/disrupt the read to write coupling and work like a shield against cross talk between adjacent signal conductor pairs. In another embodiment, e.g., FIG. 4b, the second air slot pattern 460a is offset from the first air slot pattern 460b to reduce/disrupt the read to write coupling and work like a shield against cross talk between adjacent signal conductor pairs. The addition of the partition 440 or the offset of the air slots disrupt/reduce the flow of differential return currents in the ground plane 802 resulting in lower signal loss. Also independent, unconnected and/or offset air slots 430a and 430b (or 460a and 460b) in the ground plane 802 for each conductor pair, reduce read to write coupling and work like a shield against cross talk between adjacent signal conductor pairs and surrounding interference signals inside the hard-disk-drive 111 enclosure.

FIG. 8 is a top view 800 of signal traces 801 (e.g. read or write traces), in accordance with an embodiment of the present invention, where x1 is the periodic width of the air gaps 803 and 804, and x2 is the periodic width of the base-metal layer 802. The ratio, K=x1/x2, affects characteristic impedance (Zo) of a signal trace. The ratio K, the signal trace widths, and the cross-section dimensions of the laminate layers determine the characteristic impedance of the signal traces. Therefore, the required characteristic impedance can be achieved by proper design of K, signal trace width(s), and the cross-section geometry. The period dimension, P=x1+x2, in FIG. 8 can be designed to be low with respect to the electrical signals' wavelength. Also, the period P may be constant or may vary along the signal traces' path to accommodate special electrical signal shaping.

Figure 9:
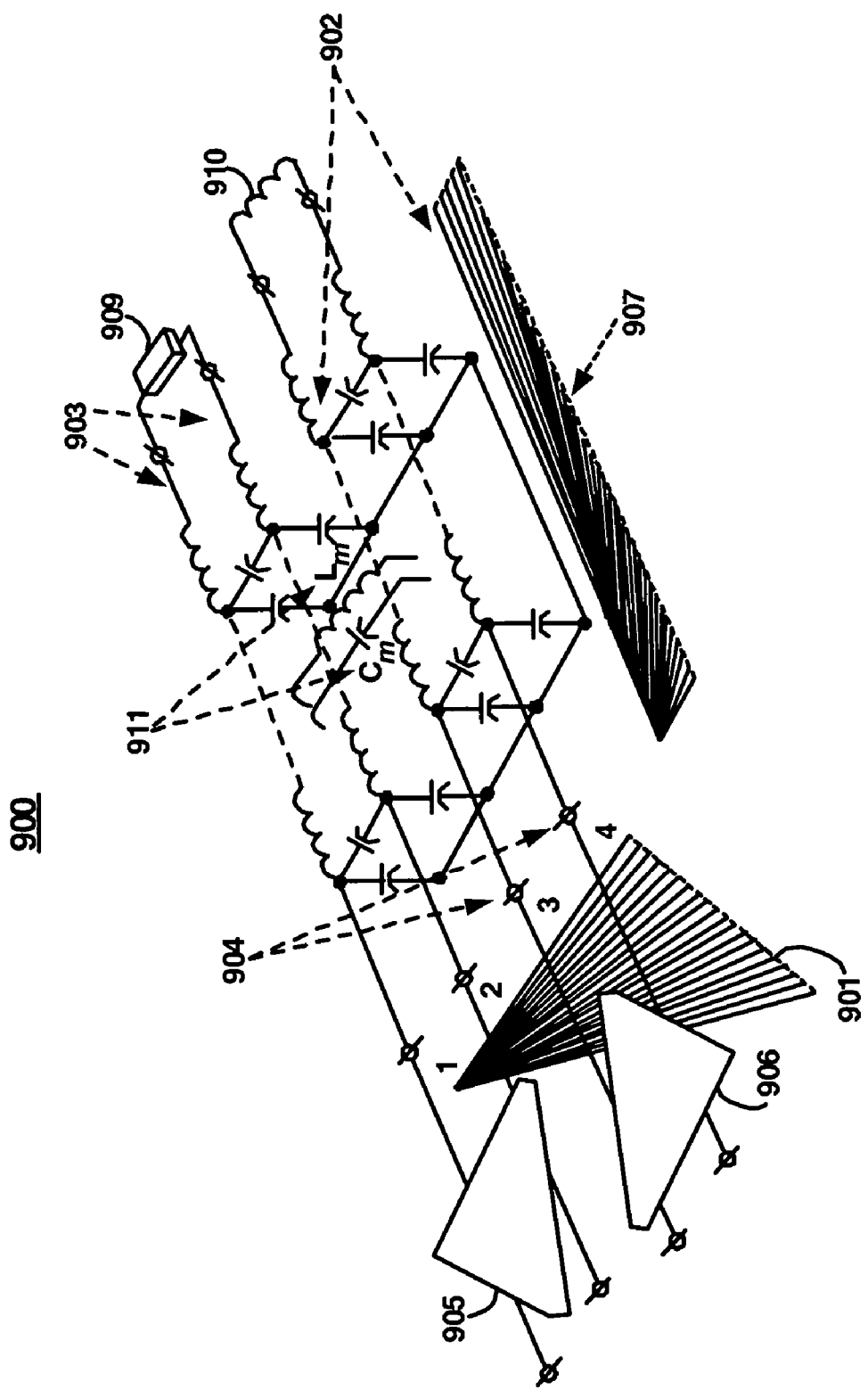
FIG. 9 is a physical-electrical schematic of the ELS with the read and write electrical connections, in accordance with one embodiment of the present invention.

FIG. 9 is a physical-electrical schematic 900 of the read and write traces 901 (read 1, 2 and write 3, 4) over the dual offset air slot base-metal 902, in accordance with an embodiment of the present invention. The cross talk source is the write driver, 906, and the write signals propagate to the write element 910 through the ELS 907. The read amplifier, 905, receives the signal from the read element 909. Here, the cross talk injection voltage (Vw) is measured across at 904, and far-end cross talk voltage (Vr) is measured across at 903. The relative cross talk level, Vct, is in dB units, where Vct=20*$\log_{10}$ (Vr/Vw). The physical separation of the dual offset air slot, for the read and write traces, reduces the mutual couple terms 911 ($C_m$ and $L_m$).

Thus, the present invention provides, in various embodiments, an electrical lead suspension having partitioned air slots. Although embodiments of the present invention are described in the context of an ELS in an information storage system, it should be understood that embodiments may apply to any device utilizing an electrical interconnect that might experience signal loss and cross talk between signal traces. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. According to one embodiment, the signal traces may be replaced with power traces.

The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electrical lead suspension having partitioned air slots comprising:
   a laminate;
   a first plurality of signal traces in a first formed layer of said laminate;
   a second plurality of traces in said first formed layer of said laminate, wherein said second plurality of traces is selected from a group consisting essentially of signal traces and power traces;
   a dielectric layer of said laminate;
   a second formed layer of said laminate;
   a partition formed in said second formed layer of said laminate; and
   a plurality of narrow, periodic and repeating air slots in said second formed layer of said laminate, said narrow, periodic and repeating air slots being partitioned by said partition into a first pattern under said first plurality of signal traces and being partitioned by said partition into a second pattern under said second plurality of traces;
   wherein said second formed layer of said laminate with said plurality of narrow, periodic and repeating air slots supports said dielectric layer supporting said first plurality of signal traces and supports said dielectric layer supporting said second plurality of traces;

wherein said narrow, periodic and repeating air slots of said first pattern are aligned perpendicular to a direction in which said first plurality of signal traces run, and wherein said narrow, periodic and repeating air slots of said second pattern are aligned perpendicular to a direction in which said second plurality of traces run; and wherein said air slots and said partition reduce/disrupt a read to write coupling and work like a shield against cross talk between adjacent signal conductor pairs.

2. The electrical lead suspension of claim 1 wherein said air slots are formed in a flexible interconnect portion of said electrical lead suspension.

3. The electrical lead suspension of claim 1 further comprising:
a plurality of read traces in said first formed layer of said laminate;
a plurality of write traces in said first formed layer of said laminate; and
dual air slots in said second formed layer of said laminate, a first of said dual air slots partitioned from a second of said dual air slots, an electrical lead suspension portion having a first portion of said second formed layer of said laminate having said first of said dual air slots and an electrical lead suspension portion having a second portion of said second formed layer of said laminate having said second of said dual air slots;
wherein said first of said dual air slots are offset from said second of said dual air slots, and wherein said first portion of said second formed layer of said laminate supports said dielectric layer supporting said plurality of read traces and said second portion of said second formed layer of said laminate supports said dielectric layer supporting said plurality of write traces.

4. The electrical lead suspension of claim 3 wherein said laminate comprises at least a signal-conductor layer, a dielectric layer and a base-metal layer.

5. The electrical lead suspension of claim 4 wherein said plurality of read traces and said plurality of write traces are formed of said signal-conductor layer.

6. The electrical lead suspension of claim 4 wherein said second formed layer of said laminate of which said dual air slots are formed comprises said base-metal layer.

7. The electrical lead suspension of claim 4 wherein a thickness of said dielectric layer is variable for producing a predefined electrical characteristic impedance.

8. The electrical lead suspension of claim 1 wherein said air slots being partitioned in said first pattern are aligned with said air slots being partitioned in said second pattern.

9. The electrical lead suspension of claim 1 wherein said air slots being partitioned in said first pattern are offset from said air slots being partitioned in said second pattern.

10. The electrical lead suspension of claim 3 wherein a ratio of air gap to base-metal layer in at least one of said dual air slots is alterable to produce a predefined characteristic impedance.

11. The electrical lead suspension of claim 3 wherein a geometry of said at least one pattern of said dual air slots is alterable to achieve a predefined mechanical stiffness.

12. A method for reducing cross talk and signal loss in an electrical lead suspension having partitioned air slots comprising:
providing a laminate;
providing a first pattern of narrow, periodic and repeating air slots formed in a second formed layer of said laminate, and a second pattern of narrow, periodic and repeating air slots formed in said second formed layer of said laminate, said narrow, periodic and repeating air slots in said first pattern being partitioned from said narrow, periodic and repeating air slots in said second pattern by a partition formed in said second formed layer of said laminate, said partitioned air slots comprising said first pattern of narrow, periodic and repeating air slots and said second pattern of narrow, periodic and repeating air slots;
supporting on said second formed layer of said laminate a plurality of read traces formed in a first formed layer of said laminate above said first pattern of said partitioned air slots formed in said second formed layer of said laminate; and
supporting on said second formed layer of said laminate a plurality of write traces formed in said first formed layer of said laminate above said second pattern of said partitioned air slots formed in said second formed layer of said laminate;
wherein said narrow, periodic and repeating air slots of said first pattern are aligned perpendicular to a direction in which said plurality of read traces run, and wherein said narrow, periodic and repeating air slots of said second pattern are aligned perpendicular to a direction in which said plurality oft write traces run; and
wherein said air slots and said partition reduce/disrupt a read to write coupling and work like a shield against cross talk between adjacent signal conductor pairs.

13. The method of claim 12 wherein said providing a laminate further comprises:
providing, in said laminate, at least three layers: a signal-conductor layer, a dielectric layer and a base-metal layer.

14. The method of claim 13 wherein said providing a laminate further comprises:
forming said plurality of read traces and said plurality of write traces of said signal-conductor layer.

15. The method of claim 13 wherein said providing a laminate further comprises:
forming said first pattern of air slots and said second pattern of air slots in said base-metal layer;
wherein said first pattern of air slots are aligned with said second pattern of air slots.

16. The method of claim 13 wherein said providing a laminate further comprises:
forming said first pattern of air slots and said second pattern of air slots in said base-metal layer;
wherein said first pattern of air slots are offset from said second pattern of air slots.

17. The method of claim 13 wherein said providing a laminate further comprises:
achieving a predefined characteristic impedance by providing a corresponding thickness of said dielectric layer.

18. The method of claim 13 wherein said providing a laminate further comprises:
achieving a predefined characteristic impedance by providing a corresponding signal trace width(s) formed of said signal-conductor layer.

19. The method of claim 12 further comprising:
producing a predefined characteristic impedance by altering a ratio of air gap to base-metal in at least one of said first pattern of narrow, periodic and repeating air slots and said second pattern of narrow, periodic and repeating air slots.

20. The method of claim 12 further comprising:
achieving a predefined mechanical stiffness by altering a geometry of at least one of said first pattern of narrow, periodic and repeating air slots and said second pattern of narrow, periodic and repeating air slots.

21. A hard disk drive comprising:
a housing;
a disk pack mounted to said housing and having at least one magnetic disk that is rotatable relative to said housing, said disk pack defining an axis of rotation and a radial direction relative to said axis;
an actuator mounted to said housing and being movable relative to said disk pack, said actuator having a read/write head for reading data from and for writing data to disks; and
an electrical lead suspension having partitioned air slots, said electrical lead suspension coupled to said actuator, said electrical lead suspension comprising:
a laminate;
a first plurality of signal traces in a first formed layer of said laminate;
a second plurality of traces in said first formed layer of said laminate, wherein said second plurality of traces is selected from a group consisting essentially of signal traces and power traces;
a dielectric layer of said laminate;
a second formed layer of said laminate;
a partition formed in said second formed layer of said laminate; and
a plurality of narrow, periodic and repeating air slots in said second formed layer of said laminate, said narrow, periodic and repeating air slots being partitioned by said partition into a first pattern under said first plurality of signal traces and being partitioned by said partition into a second pattern under said second plurality of traces;
wherein said second formed layer of said laminate with said plurality of narrow, periodic and repeating air slots supports said dielectric layer supporting said first plurality of signal traces and supports said dielectric layer supporting said second plurality of traces;
wherein said narrow, periodic and repeating air slots of said first pattern are aligned perpendicular to a direction in which said first plurality of signal traces run, and wherein said narrow, periodic and repeating air slots of said second pattern are aligned perpendicular to a direction in which said second plurality of traces run; and
wherein said air slots and said partition reduce/disrupt a read to write coupling and work like a shield against cross talk between adjacent signal conductor pairs.

22. The hard disk drive of claim 21, wherein said laminate is comprised of at least three layers: a signal-conductor layer, a dielectric layer and a base-metal layer.

23. The hard disk drive of claim 21 wherein said plurality of read traces and said plurality of write traces are formed of said signal-conductor layer.

24. The hard disk drive of claim 21 wherein said air slots being partitioned in said first pattern are aligned with said air slots being partitioned in said second pattern.

25. The hard disk drive of claim 21 wherein said air slots being partitioned in said first pattern are offset from said air slots being partitioned in said second pattern.

26. The hard disk drive of claim 21 wherein a ratio of air gap to base-metal in air slots of at least one pattern of said partitioned air slots is alterable to produce a predefined characteristic impedance.

27. The hard disk drive of claim 21 wherein a geometry of air slots of at least one pattern of said partitioned air slots is alterable to achieve a predefined mechanical stiffness.

28. An electrical lead suspension having partitioned air slots comprising:
a means for providing a laminate;
a means for providing a first pattern of narrow, periodic and repeating air slots formed in a second formed layer of said laminate, and a second pattern of narrow, periodic and repeating air slots formed in said second formed layer of said laminate, said narrow, periodic and repeating air slots in said first pattern being partitioned from said narrow, periodic and repeating air slots in said second pattern by a partition formed in said second formed layer of said laminate, said partitioned air slots comprising said first pattern of narrow, periodic and repeating air slots and said second pattern of narrow, periodic and repeating air slots;
a means for supporting on said second formed layer of said laminate a plurality of read traces formed in a first formed layer of said laminate above said first pattern of said partitioned air slots formed in said second formed layer of said laminate; and
a means for supporting on said second formed layer of said laminate a plurality of write traces formed in said first formed layer of said laminate above said second pattern of said partitioned air slots formed in said second formed layer of said laminate;
wherein said narrow, periodic and repeating air slots of said first pattern are aligned perpendicular to a direction in which said plurality of read traces run, and wherein said narrow, periodic and repeating air slots of said second pattern are aligned perpendicular to a direction in which said plurality oft write traces run; and
wherein said air slots and said partition reduce/disrupt a read to write coupling and work like a shield against cross talk between adjacent signal conductor pairs.

29. An electrical lead suspension having offset air slots comprising:
a laminate;
a first plurality of signal traces in a first formed layer of said laminate;
a second plurality of traces in said first formed layer of said laminate, wherein said second plurality of traces is selected from a group consisting essentially of signal traces and power traces;
a dielectric layer of said laminate;
a second formed layer of said laminate;
a partition formed in said second formed layer of said laminate; and
a plurality of narrow, periodic and repeating air slots in said second formed layer of said laminate, said narrow, periodic and repeating air slots being partitioned by said partition into a first pattern under said first plurality of signal traces and being partitioned by said partition into a second pattern under said second plurality of traces;
wherein said second formed layer of said laminate with said plurality of narrow, periodic and repeating air slots supports said dielectric layer supporting said first plurality of signal traces and supports said dielectric layer supporting said second plurality of traces, and wherein said narrow, periodic and repeating air slots being partitioned in said first pattern are offset from said narrow, periodic and repeating air slots being partitioned in said second pattern, said narrow, periodic and repeating air slots in said first pattern forming a first of dual offset air slots and said narrow, periodic and repeating air slots in said second pattern forming a second of dual offset air slots; and
wherein said narrow, periodic and repeating air slots of said first pattern are aligned perpendicular to a direction in which said first plurality of signal traces run, and wherein said narrow, periodic and repeating air slots of said second pattern are aligned perpendicular to a direction in which said second plurality of traces run; and wherein said air slots and said partition reduce/disrupt a read to write coupling and work like a shield against cross talk between adjacent signal conductor pairs.

30. The electrical lead suspension of claim 29 wherein said air slots are formed in a flexible interconnect portion of said electrical lead suspension.

31. The electrical lead suspension of claim 29 further comprising:

a plurality of read traces in said first formed layer of said laminate;

a plurality of write traces in said first formed layer of said laminate; and dual offset air slots in said second formed layer of said laminate, a first of said dual offset air slots offset from a second of said dual offset air slots, an electrical lead suspension portion having a first portion of said second formed layer of said laminate having said first of said dual offset air slots and an electrical lead suspension portion having a second portion of said second formed layer of said laminate having said second of said dual offset air slots, wherein said first portion of said second formed layer of said laminate supports said dielectric layer supporting said plurality of read traces and said second portion of said second formed layer of said laminate supports said dielectric layer supporting said plurality of write traces.

32. The electrical lead suspension of claim 31 wherein said laminate comprises at least a signal-conductor layer, a dielectric layer and a base-metal layer.

33. The electrical lead suspension of claim 32 wherein said plurality of read traces and said plurality of write traces are formed of said signal-conductor layer.

34. The electrical lead suspension of claim 32 wherein said second formed layer of said laminate in which said dual offset air slots are formed comprises said base-metal layer.

35. The electrical lead suspension of claim 32 wherein a thickness of said dielectric layer is variable for producing a predefined electrical characteristic impedance.

36. The electrical lead suspension of claim 32 wherein a thickness of said dielectric layer is variable for producing a predefined mechanical stiffness.

37. The electrical lead suspension of claim 34 wherein said base-metal layer is stainless steel.

38. The electrical lead suspension of claim 36 wherein a ratio of air gap to stainless steel in at least one of said dual offset air slots is alterable to produce a predefined characteristic impedance.

39. The electrical lead suspension of claim 31 wherein a geometry of said at least one pattern of said dual offset air slots is alterable to achieve a predefined mechanical stiffness.

* * * * *